United States Patent
Huang et al.

(10) Patent No.: US 6,663,416 B2
(45) Date of Patent: Dec. 16, 2003

(54) HEAT-DISSIPATING MODULE

(75) Inventors: Wen-Shi Huang, Taoyuan (TW); Chao-Wu Wen, Taoyuan (TW); Te-Tsai Chuang, Miaoli (TW); Ida Hsu, Tainan (TW)

(73) Assignee: Delta Electronics Inc. (TW)

( * ) Notice: Subject to any disclaimer, the term of this patent is extended or adjusted under 35 U.S.C. 154(b) by 1 day.

(21) Appl. No.: 10/060,325

(22) Filed: Feb. 1, 2002

(65) Prior Publication Data

US 2002/0142646 A1 Oct. 3, 2002

(30) Foreign Application Priority Data

Mar. 27, 2001 (TW) ........................................ 90204601 U

(51) Int. Cl.[7] .............................................. H01R 13/00
(52) U.S. Cl. ...................................... 439/485; 361/695
(58) Field of Search ................................ 439/485, 487; 361/688, 690, 692, 693, 694, 695

(56) References Cited

U.S. PATENT DOCUMENTS

| | | | | |
|---|---|---|---|---|
| 5,562,410 A | * | 10/1996 | Sachs et al. | 415/213.1 |
| 5,638,895 A | * | 6/1997 | Dodson | 165/121 |
| 6,075,698 A | * | 6/2000 | Hogan et al. | 361/695 |
| 6,406,257 B1 | * | 6/2002 | Houdek | 415/213.1 |

\* cited by examiner

*Primary Examiner*—Tulsidas Patel
(74) *Attorney, Agent, or Firm*—Birch, Stewart, Kolasch & Birch, LLP

(57) ABSTRACT

The heat-dissipating module includes at least one heat-dissipating device and a terminal mounted and fixed on one side of the heat-dissipating device and electrically connected with the heat-dissipating device. As the heat-dissipating module is inserted into a frame of the system, the terminal will be received by a receptacle inside the system such that the heat-dissipating module can be electrically connected to the system. The heat-dissipating module can be easily dissembled and replaced in a system without turning off the system and can provide the best heat-dissipating efficiency in a limited space of the system without being affected by the inside height or thickness of the system.

18 Claims, 6 Drawing Sheets

HEAT-DISSIPATING MODULE

FIELD OF THE INVENTION

The present invention is related to a heat-dissipating module and especially to a heat-dissipating module feasible for hot swap in a system.

BACKGROUND OF THE INVENTION

A heat-dissipating device, e.g. a fan, is often used to dissipate the heat generated due to the operation of the electronic device. The heat dissipation is always the essential problem in the application of electronic devices. A good heat-dissipating mechanism usually represents a stable performance of the electronic device. If an electronic device is operated under an abnormally dissipating condition, it will inevitably lead to an unstable performance and reduce its useful life.

Typically, a general electronic device only needs a fan. However, a high-level electronic system needs more fans so as to sufficiently dissipate the generated heat. Further, using more fans is helpful for increasing the stability of the electronic system. Currently, many high-level electronic appliances have heat-dissipating devices that are hot swappable. For example, a hot swappable heat-dissipating device is widely used to a server of a computer system. The heat-dissipating device is designed to be feasible for hot swap by being mounted thereon terminal connectors for receiving power or signals from the system. In other words, when the heat-dissipating device can be changed in case of malfunction, test or maintenance without turning off the system.

In order to attain the purpose of hot swap, there are many kinds of designs for fan module. Please refer to FIG. 1A which is a schematic diagram of a conventional fan module 11. Two fans 11 are electrically connected with a terminal connector 12 through a plurality of conductive wires 13 and the terminal connector 12 is electrically connected to a receptacle of a system (not shown) when these two fans 11 are combined together by screws and inserted into the system frame 14 for transmitting the power or signal between the system as shown in FIG. 1B. In such a high-level electronic system, these two fans are viewed as a fan module and a plurality of fan modules are inserted in the system frame in parallel for increasing the stability of the system.

However, this way still results in the difficulty to lead so many conductive wires. Furthermore, when one of these fan modules is malfunctioned in operation, it is uneasy to disassemble and replace it. Moreover, when one fan in the fan module is out of order, the entire fan module must be replaced, thereby resulting in an increased cost.

Thus, it is desirable to develop a hot swappable heat-dissipating module to overcome the above-described drawbacks and provide more convenient use and design for users and system designers in a limited space.

SUMMARY OF THE INVENTION

An object of the present invention is to provide a heat-dissipating module feasible for hot swap in a system.

Another object of the present invention is to provide a hot swappable heat-dissipating module for providing the best heat-dissipating efficiency in a limited space without being affected by the inside height or thickness of a system.

Another yet object of the present invention is to provide a hot swappable heat-dissipating module which can be easily disassembled and replaced in case of malfunction.

According to the present invention, the heat-dissipating module includes at least one heat-dissipating device and a terminal mounted and fixed on one side of the heat-dissipating device and electrically connected with the heat-dissipating device. As the heat-dissipating module is inserted into a frame of the system, the terminal will be received by a receptacle inside the system such that the heat-dissipating module can be electrically connected to the system.

Preferably, the heat-dissipating device is an axial-flow fan.

The terminal can be electrically connected with the heat-dissipating device by wires, weldings, contacts or pins. The terminal further includes a plurality of pins to be inserted in holes of the receptacle for electrically connecting the heat-dissipating module with the system.

Preferably, the heat-dissipating module further includes a securing device mounted on the one side of the heat-dissipating device for fixing the terminal. The securing device is assembled with the heat-dissipating device by screws, rivets, adhesives or engaging members. The securing device can be formed as an L-shaped structure. Additionally, the securing device includes a bracket extending outwardly from a side thereof for disposing the terminal thereon and has a plurality of elastic pieces respectively mounted on a plurality of retaining holes formed on a surface thereof such that as the heat-dissipating module is inserted into the frame of the system and a housing of the system is covered on the frame, the plurality of elastic pieces will urge against the housing of the system for fixing the heat-dissipating module in the frame.

Preferably, the heat-dissipating module is inserted into the frame of the system through a tray to be electrically connected with the system. The tray can be separated into a plurality of compartments by a plurality of supports for respectively disposing a plurality of the heat-dissipating modules therein. In addition, the tray further includes a plurality of terminal receivers to be mounted on each of the plurality of supports such that when each of the plurality of heat-dissipating modules is inserted into the tray, the terminal will be received by the terminal receiver for electrically connecting the heat-dissipating module with the system. The tray can be fixed to the frame by screws, rivets or engaging members.

The present invention may best be understood through the following description with reference to the accompanying drawings, in which:

DETAILED DESCRIPTION OF THE PREFERRED EMBODIMENT

The present invention will now be described more detailedly with reference to the following embodiments. It is to be noted that the following descriptions of the preferred embodiments of this invention are presented herein for the purpose of illustration and description only. It is not intended to be exhaustive or to be limited to the precise form disclosed.

The present invention provides a heat-dissipating module feasible for hot swap in a system. The heat-dissipating module includes a heat-dissipating device and a terminal fixed on one side of the heat-dissipating device and electrically connected with the heat-dissipating device. As the heat-dissipating module is inserted into the system frame, the terminal will be directly received by a receptacle mounted inside the system frame so as to electrically connect the heat-dissipating module with the system. Of course, the design and concept of the present invention can also be applied to the combination of two or more heat-dissipating devices. For convenience sake, two heat-dissipating fans are exemplified to describe the characteristics of the present invention but should not be used to limit the claimed scope of the present invention.

Figure 1A:
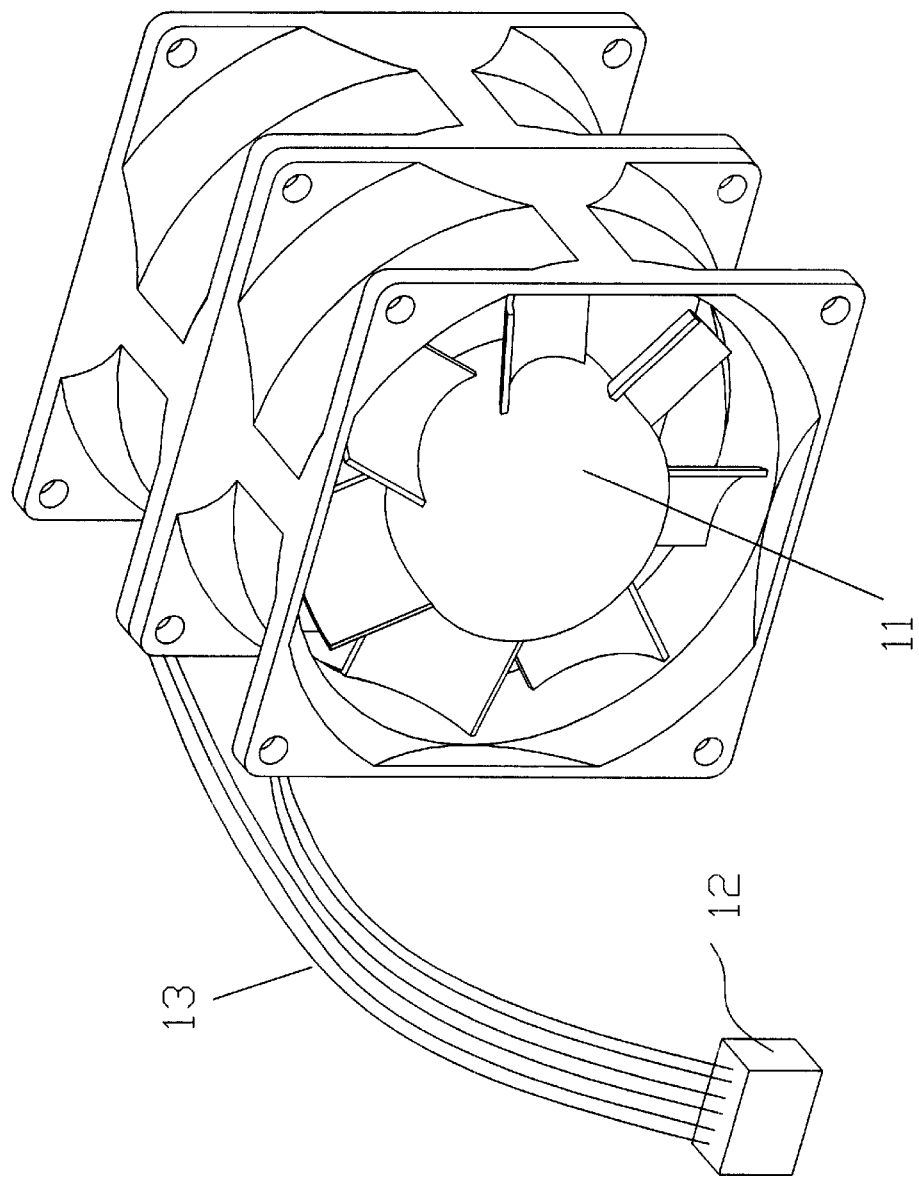
FIG. 1A is a perspective view of a conventional fan module.
Figure 1B:
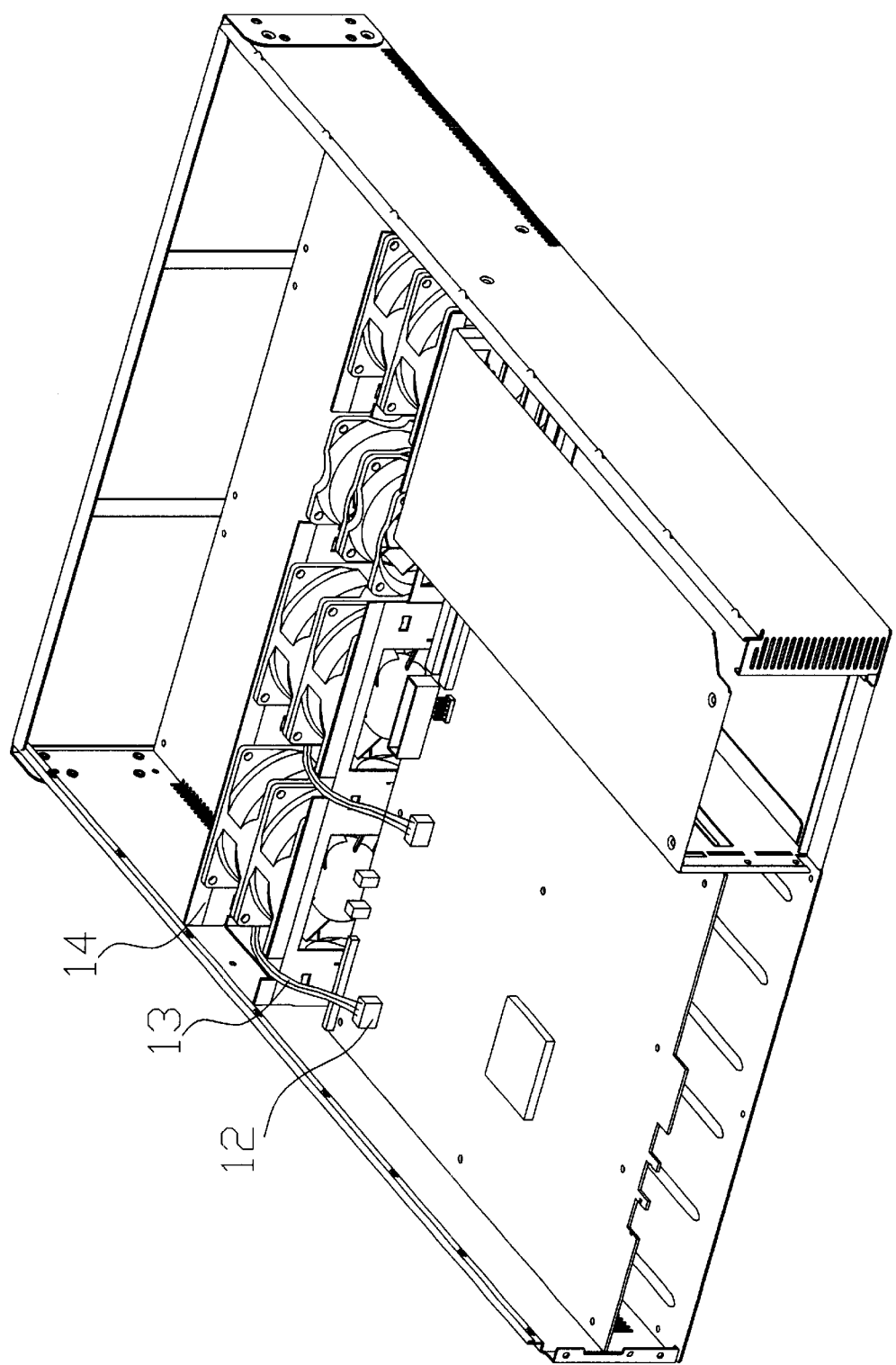
FIG. 1B shows how a plurality of conventional fan modules are assembled in the system frame.
Figure 2A:
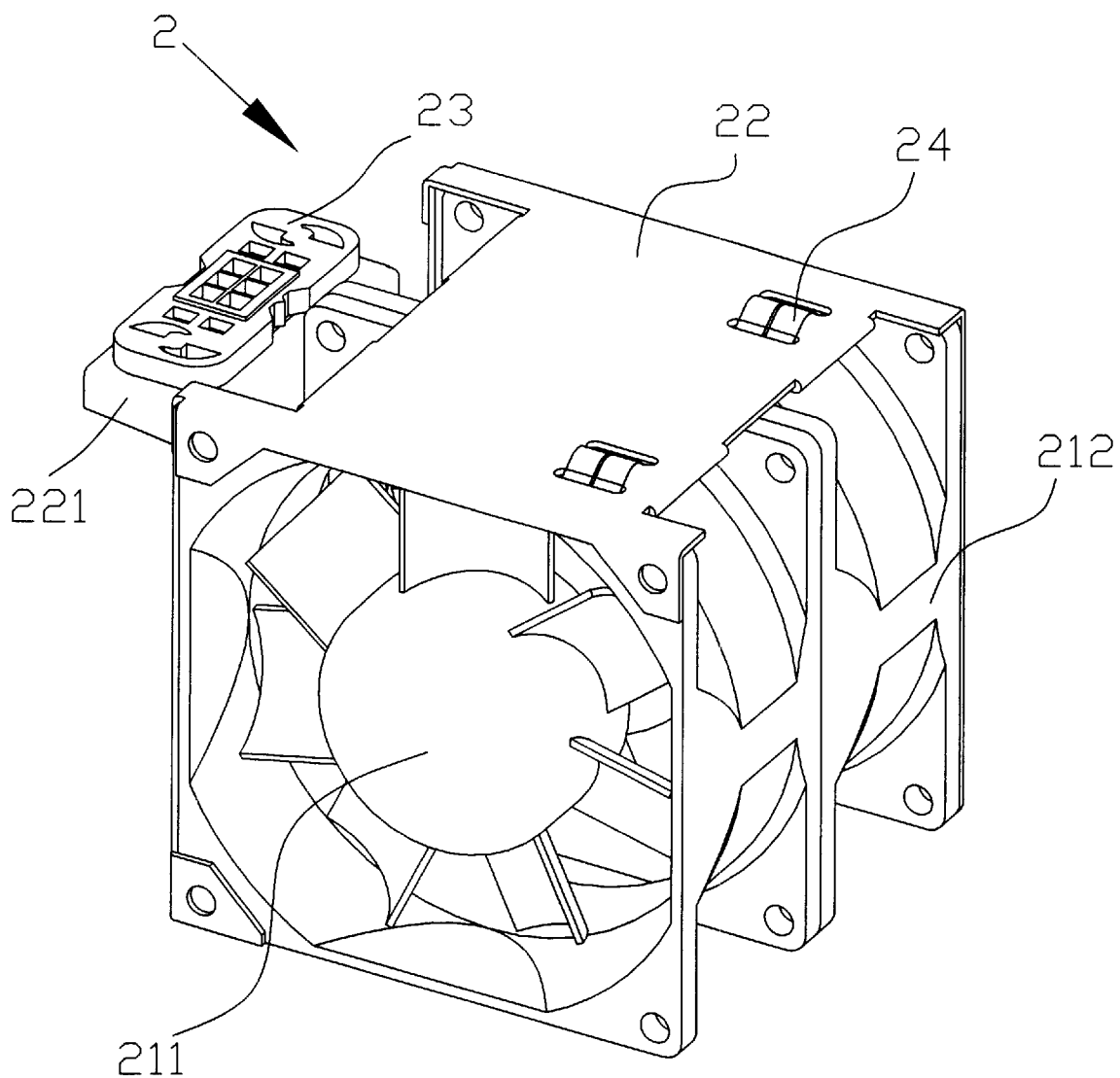
FIG. 2A is a perspective view of a preferred embodiment of the heat-dissipating module according to the present invention.

Please refer to FIG. 2A which is a perspective view of a preferred embodiment of the heat-dissipating module 2 according to the present invention. In this embodiment, two fans 211, 212 are assembled by a securing device 22. Preferably, the securing device 22 is an L-shaped structure which can be constituted by two independent plates or can be integrally formed. In addition, the securing device 22 can be made of metal or insulating material such as plastic. The securing device 22 is mounted and connected on the side of two assembled fans 211, 212 through screws, rivets, adhesives, welds or engaging members. In addition, a terminal 23 is mounted and fixed on a bracket 221 extending outwardly from the securing device 22, and is electrically connected to the two fans 211, 212 through wires, contacts, pins or welds. The bracket 221 can be formed by outwardly folding a sectional piece cut from the securing device 22.

Figure 2B:
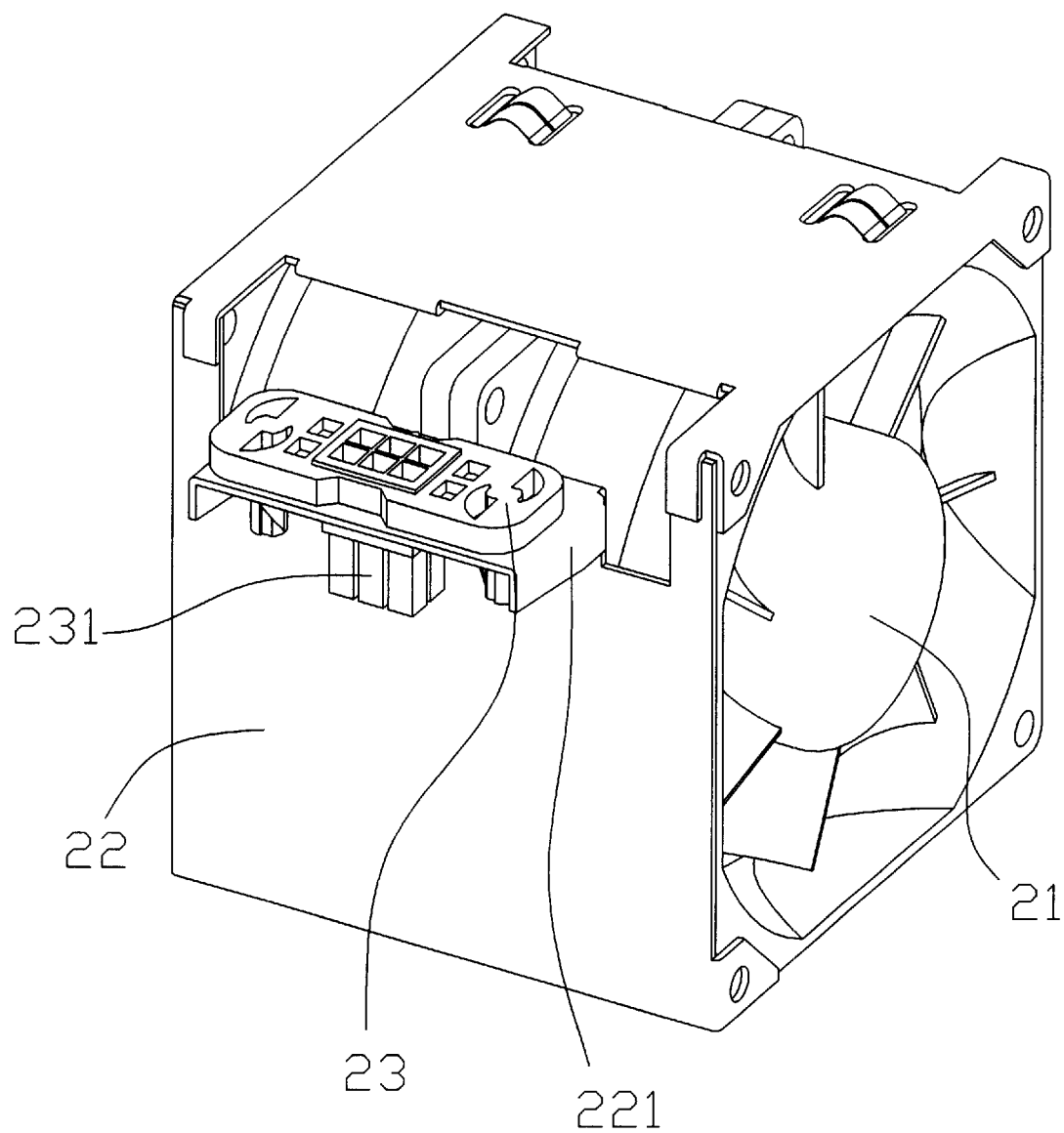
FIG. 2B is a perspective view of the heat-dissipating module of FIG. 2A viewed from another angle.

Now, please refer to FIG. 2B which is a perspective view of the fan module of FIG. 2A viewed from another angle. It can be observed that the terminal 23 includes a plurality of pins 231. As the heat-dissipating module is inserted into the system frame, the pins of the terminal 23 can be directly inserted into the holes of one receptacle inside the system (not shown) so that the heat-dissipating module can be electrically connected with the system through the terminal 23.

In the specific embodiment, the securing device has a bracket extending outwardly from one side thereof for disposing the terminal 23 thereon and includes a plurality of elastic pieces 24 mounted on a plurality of retaining holes formed on the surface of another side thereof (that is, the side faced upwardly as shown in FIG. 2A). In the case of directly inserting the heat-dissipating module 2 into the system frame without fixation, the plurality of elastic pieces 24 can urge against the outer housing of the system after the housing is covered on the system frame so that the heat-dissipating module 2 can be fixed in the system frame for preventing the vibration when the fans are operating.

Figure 3A:
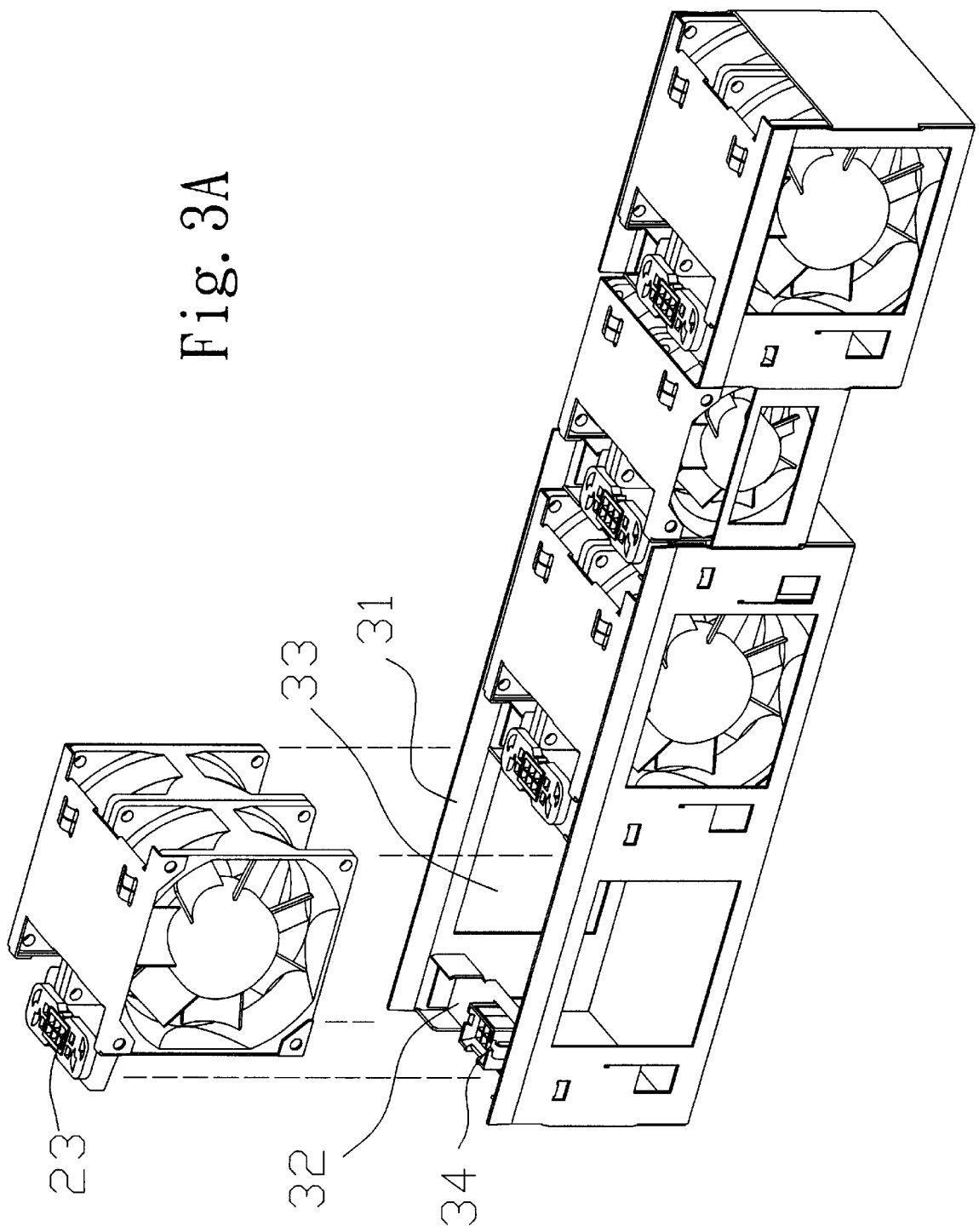
FIG. 3A shows the assembly of another preferred embodiment of the heat-dissipating module according to the present invention.
Figure 3B:
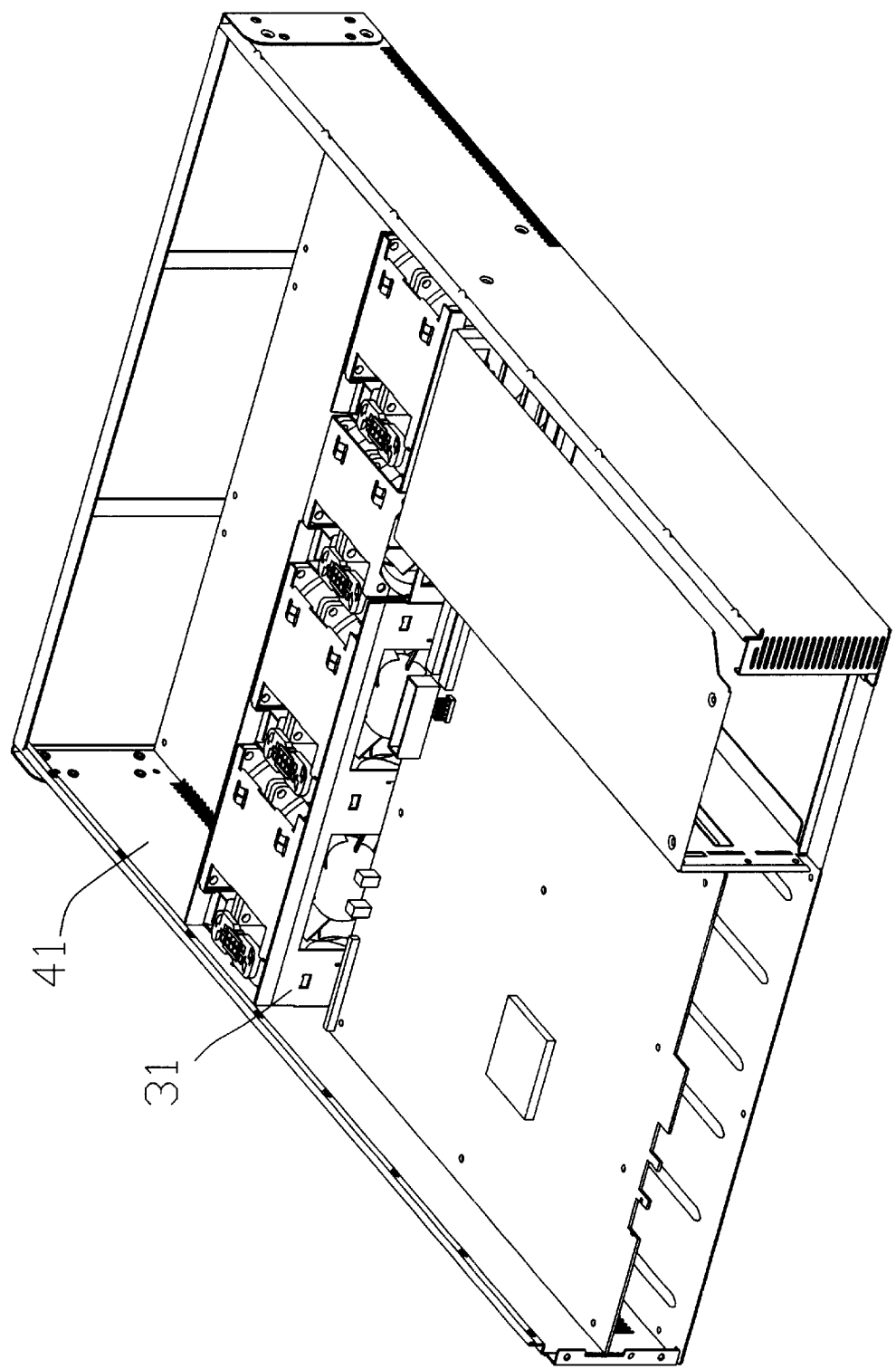
FIG. 3B shows the assembly of the heat-dissipating module of FIG. 3A after inserted into the system frame.

Additionally, please refer to FIG. 3A shows the assembly of another preferred embodiment of the heat-dissipating module, wherein a plurality of fan modules identical to the above-described heat-dissipating module 2 are assembled with a fan tray 31 and then the entire fan tray 31 containing the fan modules is inserted into the system frame. The fan tray 31 is separated into a plurality of compartments by a plurality of supports 32 for respectively disposing the plurality of fan modules therein. In addition, a terminal receiver 34 is mounted on each support 32 such that when each fan module is inserted into the fan tray 31, the plurality of pins 231 of the terminal 23 of the fan module can be directly inserted into holes of the terminal receiver 34. When the entire fan tray 31 having a plurality of fan modules assembled thereon is inserted into the system frame (not shown), each fan module can be electrically connected to the system through the respective terminal for transmitting the power or signal between the system and the fan module. The fan tray 31 can be fixed to the system frame 41 by screws, rivets or engaging members, as shown in FIG. 3B.

In conclusion, the present invention provides a hot swappable heat-dissipating module for effectively and significantly increasing the heat-dissipating efficiency in a limited space without being affected by the inside height or thickness of a system. For example, when the inside height of the system is 85 mm, the heat-dissipating fan of 80 mm can be used and the terminal can be designed to be mounted on the side of the heat-dissipating fan to construct a fan module. Certainly, according to the aspect of the present invention, the terminal can be mounted on the front, rear, right or left side of the heat-dissipating fan so that the application of the heat-dissipating fan will not be affected by the inside height or thickness of the system. As the fan module is inserted into the system frame, the pins of the terminal 23 can be directly received by the receptacle of the system so that the fan module can be electrically connected with the system through the terminal for transmitting the power or signal between the system and the fan module. Thus, in the present invention, it is unnecessary to spend time on leading many conductive wires like the prior art. In addition, in case of malfunction, test or maintenance, the fan tray or single fan module can be easily disassembled and replaced without turning off the system.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat-dissipating module for being used in a system, comprising:
   a heat-dissipating device with a rotary axis; and
   a terminal, electrically connected with said heat-dissipating device, mounted and fixed on one side of said heat-dissipating device so that said heat-dissipating device is inserted into a frame of said system in a direction normal to the rotary axis, wherein as said heat-dissipating module is inserted into said frame of said system, said terminal will be received by a receptacle inside said system such that said heat-dissipating module will be electrically connected to said system.

2. The heat-dissipating module according to claim 1 wherein said heat-dissipating device is an axial-flow fan.

3. The heat-dissipating module according to claim 1 wherein said terminal is electrically connected with said heat-dissipating device by one way selected from a group consisting of wires, weldings, contacts, and pins.

4. The heat-dissipating module according to claim 1 wherein said terminal includes a plurality of pins to be inserted in holes of said receptacle for electrically connecting said heat-dissipating module with said system.

5. The heat-dissipating module according to claim 1 further comprising a securing device mounted on said one side of said heat-dissipating device for fixing said terminal.

6. The heat-dissipating module according to claim 5 wherein said securing device is assembled with said heat-dissipating device by one way selected from a group consisting of screws, rivets, adhesives and engaging members.

7. The heat-dissipating module according to claim 5 wherein said securing device is an L-shaped structure.

8. The heat-dissipating module according to claim 5 wherein said securing device includes a bracket extending outwardly from a side thereof for disposing said terminal thereon.

9. The heat-dissipating module according to claim 5 wherein said securing device further has a plurality of elastic pieces respectively mounted on a plurality of retaining holes formed on a surface thereof such that as said heat-dissipating module is inserted into said frame of said system and a housing of said system is covered on said frame, said plurality of elastic pieces will urge against said housing of said system for fixing said heat-dissipating module in said frame.

10. A heat-dissipating module for being used in a system, comprising:
   a plurality of heat-dissipating devices;
   a securing device mounted on sides of said plurality of heat-dissipating devices for assembling said plurality of heat-dissipating devices together; and
   a terminal mounted near to said plurality of heat-dissipating devices and fixed on said securing device and electrically connected with each of said plurality of heat-dissipating devices, wherein when said heat-dissipating module is inserted into a frame of said system, said heat-dissipating module will be electrically connected to said system through said terminal.

11. The heat-dissipating module according to claim 10 wherein said terminal is electrically connected with said plurality of heat-dissipating devices by one way selected from a group consisting of wires, weldings, contacts and pins.

12. The heat-dissipating module according to claim 10 wherein said securing device is an L-shaped structure.

13. The heat-dissipating module according to claim 10 wherein said securing device is assembled with said plurality of heat-dissipating devices by one way selected from a group consisting of screws, rivets, adhesives and engaging members.

14. The heat-dissipating module according to claim 10 wherein said securing device further has a plurality of elastic pieces respectively mounted on a plurality of retaining holes formed on a surface thereof such that as said heat-dissipating module is inserted into said frame of said system and a housing of said system is covered on said frame, said plurality of elastic pieces will urge against said housing of said system for fixing said heat-dissipating module in said frame.

15. The heat-dissipating module according to claim 10 wherein said heat-dissipating module is inserted into said frame of said system through a tray to be electrically connected with said system.

16. The heat-dissipating module according to claim 15 wherein said tray is separated into a plurality of compartments by a plurality of supports for respectively disposing a plurality of said heat-dissipating modules therein.

17. The heat-dissipating module according to claim 16 wherein said tray further includes a plurality of terminal receivers to be mounted on each of said plurality of supports such that when each of said plurality of heat-dissipating modules is inserted into said tray, said terminal will be received by said terminal receiver for electrically connecting said heat-dissipating module with said system.

18. The heat-dissipating module according to claim 10 wherein said tray is fixed to said frame by a manner selected from a group consisting of screws, rivets and engaging members.

* * * * *